United States Patent [19]
Keiichi

[11] Patent Number: 5,153,463
[45] Date of Patent: Oct. 6, 1992

[54] PROGRAMMABLE LOGIC DEVICE HAVING A REDUCED SWITCHING MATRIX

[75] Inventor: Kawana Keiichi, Chiba, Japan
[73] Assignee: Kawasaki Steel Corporation, Japan
[21] Appl. No.: 682,007
[22] Filed: Apr. 8, 1991

[30] Foreign Application Priority Data

Apr. 11, 1990 [JP] Japan ................... 2-95924

[51] Int. Cl.⁵ .................. H03K 17/00; H03K 19/177
[52] U.S. Cl. ................. 307/465; 307/303.2; 340/825.83
[58] Field of Search ............... 307/465–469, 307/303.2; 340/825.83, 825.87

[56] References Cited

U.S. PATENT DOCUMENTS

| | | | |
|---|---|---|---|
| 4,642,487 | 2/1987 | Carter | 307/465.1 X |
| 4,786,904 | 11/1988 | Graham, III et al. | 307/465 X |
| 4,873,459 | 10/1989 | El Gamal et al. | 307/465 |
| 5,003,200 | 3/1991 | Sakamoto | 307/465 |

OTHER PUBLICATIONS

Negrini et al. "Fault Tolerance Through Reconfiguration of VLSI and WSI Arrays", 1989, MIT Press, Cambridge, US, p. 50 @2, p. 154 @2 and p. 240 @5 Figs 13.9, 13.10.
IEEE Transactions on Computers "The Topology of Cellular Partitioning Networks" Feb. 1981, New York, vol. C-30, No. 2, pp. 164–168.

*Primary Examiner*—David Hudspeth
*Attorney, Agent, or Firm*—Oliff & Berridge

[57] ABSTRACT

A programmable wiring is provided for connecting wiring elements in a channel region with each other in a programmable manner, the programmable wiring including programmable switches of the number less than the number of all combinations in the direction of connection in a switching matrix for connecting the wiring elements in accordance with a program. The number of programmable switches for connecting the respective wiring elements with each other in a straight direction is less than the number of programmable switches for connecting the respective wiring elements in a turn direction, a ratio of both numbers being preferably selected to be 0.2:1 to 0.5:1.

4 Claims, 8 Drawing Sheets

O : STRAIGHT DIRECTION

● : TURN DIRECTION

○ : STRAIGHT DIRECTION

● : TURN DIRECTION

| WIRING LENGTH (NORMA-RIZED) | NUMBER OF CASES | | SHARE TO WHOLE WIRING LENGTH (%) | SHARE OF EACH WIRING PATTERN(%) | |
|---|---|---|---|---|---|
| | L | — | | L | — |
| d | 20 | 8 | 47 | 33.57 | 13.43 |
| 2d | 26 | 7 | 24 | 18.91 | 5.09 |
| 3d | 70 | 32 | 12 | 8.24 | 3.76 |
| 4d | 18 | 15 | 6 | 3.27 | 2.73 |
| 5d | 76 | 64 | 6 | 3.26 | 2.74 |
| | | | total | 67.25 (70.8%) | 27.75 (29.2%) |

□d  <5d

×1

2d

×1

3d FIG.3C
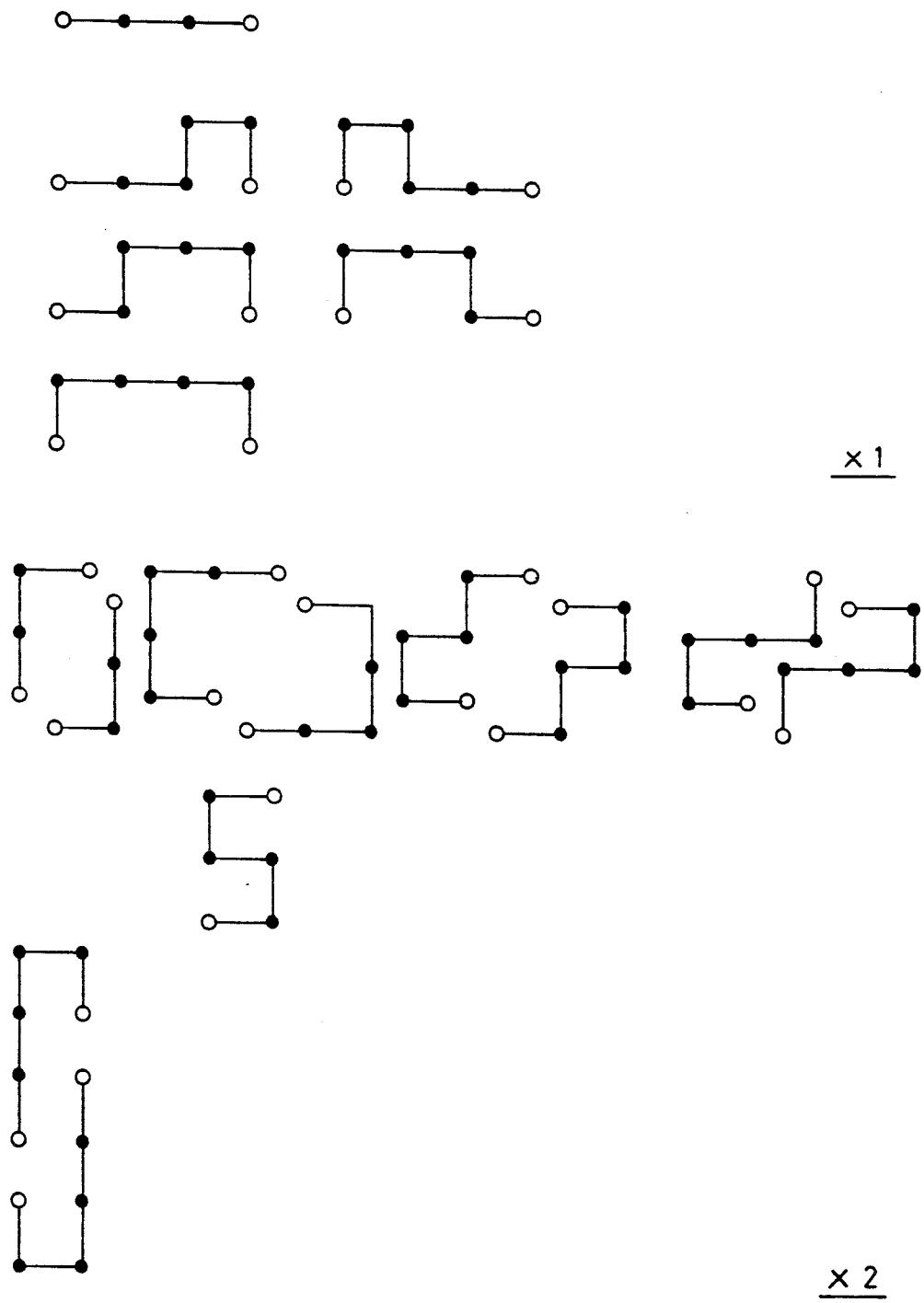
×1
×2

4d

×1

×1

×1

PROGRAMMABLE LOGIC DEVICE HAVING A
REDUCED SWITCHING MATRIX

BACKGROUND OF THE INVENTION

1. Field of the Invention

The present invention relates to a programmable wiring for connecting wiring elements in a channel region in a semiconductor integrated circuit for example in a programmable manner.

2. Description of the Prior Art

Among many semiconductor devices there is known one in which wiring elements in a channel region are connected programmable to permit a user to construct a desired logic circuit. Such semiconductor devices sometimes include a switching matrix to connect the wiring elements with each other programmably.

FIG. 5 exemplarily illustrates the construction of such a semiconductor device. As illustrated in FIG. 5, the semiconductor device includes a plurality of function modules 10, in each of which there are incorporated programmable logic circuits, etc. Wiring channel 11 regions are located each extending among the functional modules 10 and wiring elements 12 are laid on the wiring channel 11 longitudinally and laterally. Additionally, a switching matrix 14 is located at longitudinal and lateral intersections of the wiring elements 12.

The switching matrix 14 has a function to connect arbitrary wiring elements 12 in some directions (designated by symbols N, S, E and W in FIG. 5) by turning on and off a program switch in conformity with a program inputted externally, and form a wiring. Ideally, such provision of the programmable switches at intersections of all wirings in the switching matrix 14 can make maximum the flexibility of the connections among the wiring elements.

However, such a programmable switch of the switching matrix typically comprising a large area static random access memory (SRAM) can not be provided at intersections of all wirings, and hence limits the number of those switches, which are possible to be installed. It is therefore needed to install programmable switches in a switching matrix within the above limited number. There is however existent a difficulty thereupon that provided installation positions of those switches are to be arbitrarily determined, unuseable wiring elements would occur when those switches are connected in conformity with programming.

SUMMARY OF THE INVENTION

To solve the difficulty with the prior art, it is an object of the present invention to provide a programmable wiring in which programmable switches in a switching matrix can be provided such that wiring elements are connectable without any unuseable wiring element.

To achieve the above object, a programmable wiring of the present invention is provided to connect wiring elements in a channel region with each other in a programmable manner, in which programmable wiring there are provided programmable switches of the number less than the number of all combinations of connection directions in a switching matrix for connecting the wiring elements with each other following a program, and the number of the programmable switches for connecting the wiring elements in a straight direction is less than the number of the programmable switches for connecting the wiring elements in a turn direction.

In the programmable wiring, provision of programmable switches in a switching matrix at all intersections among wiring elements assures free connection without limitation, ideally. However, an SRAM constituting a switching matrix has its large occupation area, so that the number of the programmable switches capable of installation is limited.

In this situation, for the programmable switch there are considered two types of programmable switches in view of its function, one for connection in a straight direction (e.g., connection from the direction W wiring element 12 to the direction E wiring element 12 as illustrated in FIG. 5) and the other for connection in a perpendicular direction (e.g., connection form the direction N wiring element 12 to the direction E wiring element 12). Provided programmable switches of varieties of such type are disposed without any limitation, there might occur a fear that unuseable wiring elements are brought above upon connection of the wiring elements conformably to a program.

Accordingly, the present inventor investigated on what rate the programmable switches of the above two types are useable for various semiconductor integrated circuits.

FIG. 2 illustrates results of the investigation. In FIG. 2, it is investigated how a wiring pattern connecting wiring elements in a turn direction and a wiring pattern connecting those wiring elements in a straight direction are employed on the semiconductor integrated circuit upon wiring the wiring elements along the length of wiring of from d to 5d, with d assumed to be normalized wiring length.

More specifically, in the figure, there are illustrated the number of cases where the wiring patterns in the turn direction (indicated by a symbol "L") and in the straight direction (indicated by a symbol "—") are employed with the respective wiring lengths d to 5d, occupation rates (shares) of the respective wiring lengths d to 5d with respect to the whole wiring length, and a rate of occupation of the respective wiring patterns of the respective wiring lengths d to 5d with respect to the whole wiring length.

Further, FIGS. 3A to 3E illustrate patterns of the respective wiring in the respective nomalized wiring lengths d to 5d.

Additionally, FIG. 4 exemplarily illustrates the wiring extended to the normalized wiring length d to 5d from the center to the upper to lower and left to right portion.

Referring to the result of FIG. 2, a rate of wiring length distributions, i.e., a wiring pattern for connection in the straight direction and a wiring pattern for connection in the turn direction is 29.2:70.8, about 0.14:1.

From the consideration described above, provided for the programmable switches of the switching matrix, the number of the programmable switches for connecting the wiring elements in the straight direction is made less than the number of the programmable switches for connecting the wiring elements in the turn direction, with preferably the ratio of both numbers lies between 0.2:1 and 0.5:1, programmable switches capable of connection suited to various wirings can be provided.

In accordance with the present invention, upon connecting the wiring elements with each other using programmable switches, any unuseable wiring element can securely be prevented from being produced. Accordingly, a switching matrix can be constructed only with necessary programmable switches. This reduces the area of the switching matrix without losing the function of the programmable wiring.

BRIEF DESCRIPTION OF THE DRAWINGS

The preferred embodiments will be described with reference to the drawings, wherein like elements have been denoted throughout the figure with like reference numerals, and wherein:

FIGS. 3A through 3E are views each illustrating examples of wiring patterns in each normalized wiring length;

DESCRIPTION OF THE PREFERRED EMBODIMENT

In what follows, an embodiment of the present invention will be described in detail.

The embodiment is adapted by applying the present invention to a programmable switch provided in a switching matrix 14 for connecting wiring elements 1, 2 and 3, three wires respectively in direction N, S, E and W.

Figures 1, 2:
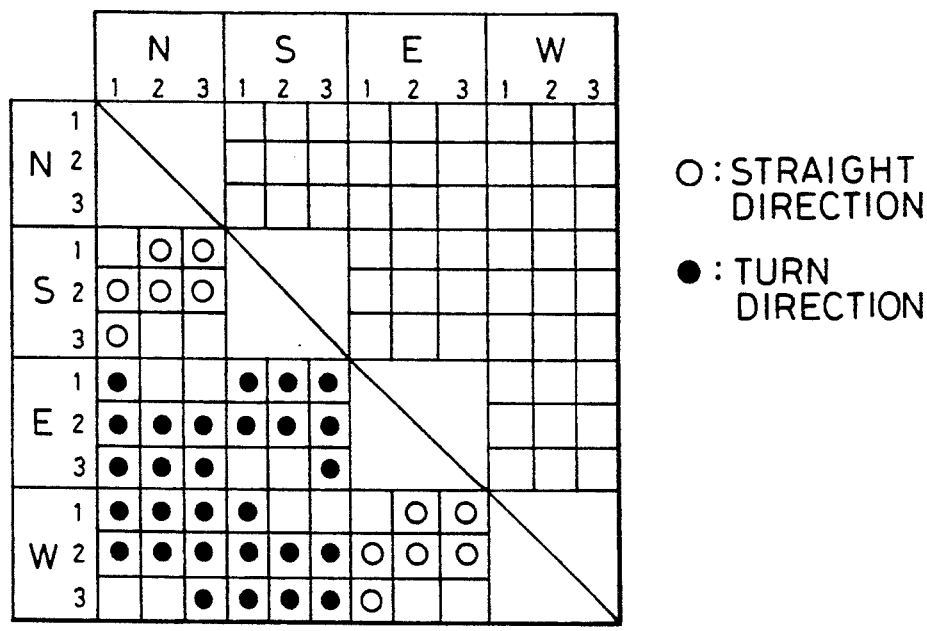
FIG. 1 is a diagram exemplarily illustrating the arrangement of programmable switches in a switching matrix associated with an embodiment of the present invention.
FIG. 2 is a diagram exemplarily illustrating the distribution patterns of programmable switches in straight and turn direction with respect to wiring lengths, for description of the principle of the present invention.
Figure 3A:
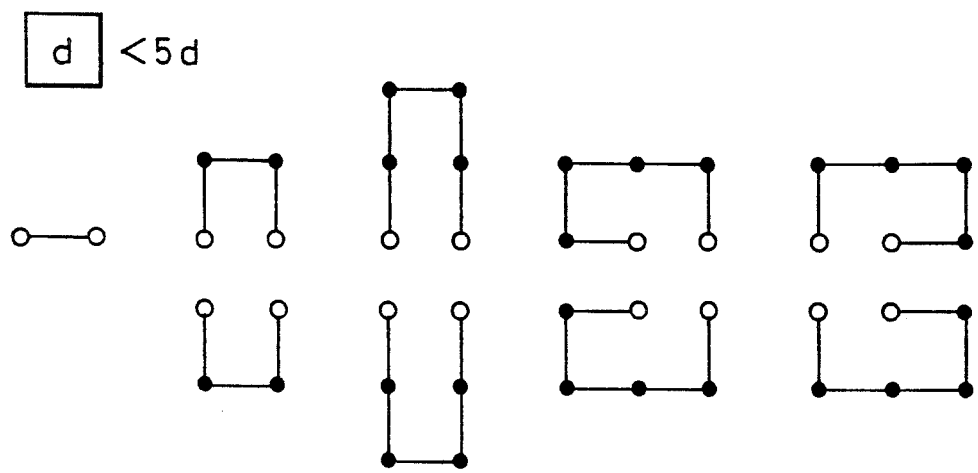
Figure 3B:
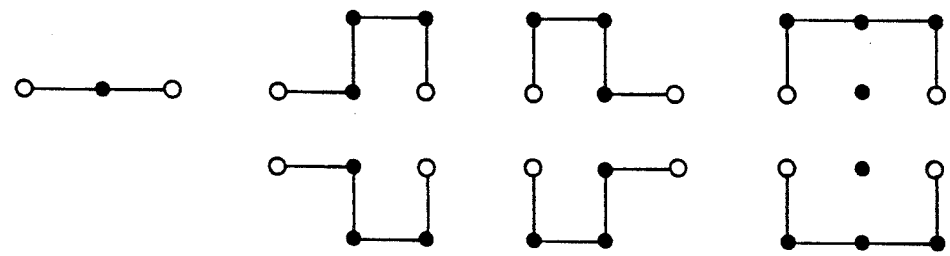
Figure 3B:
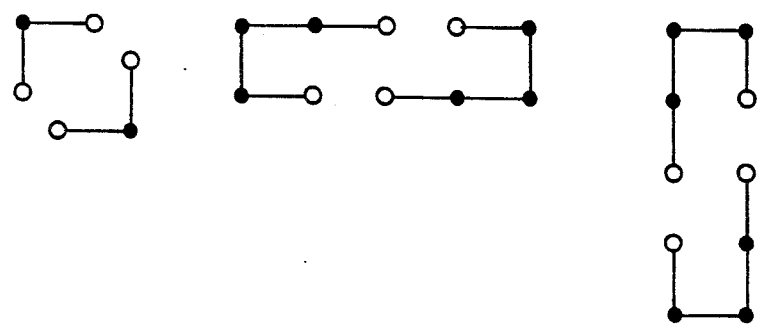
Figure 3D:
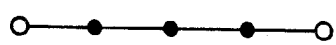
Figure 3D:
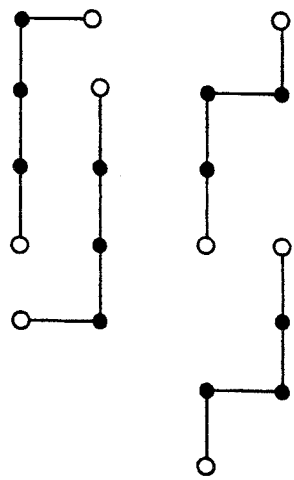
Figure 3D:
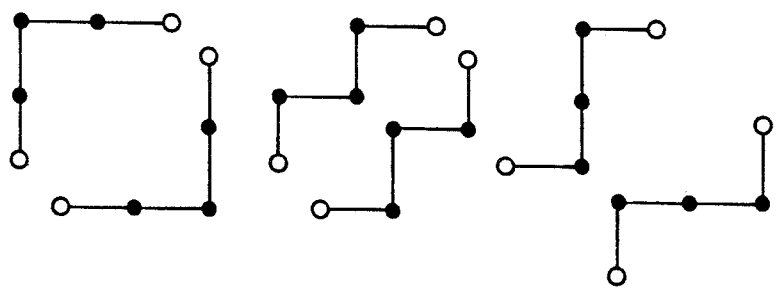
Figure 3E:
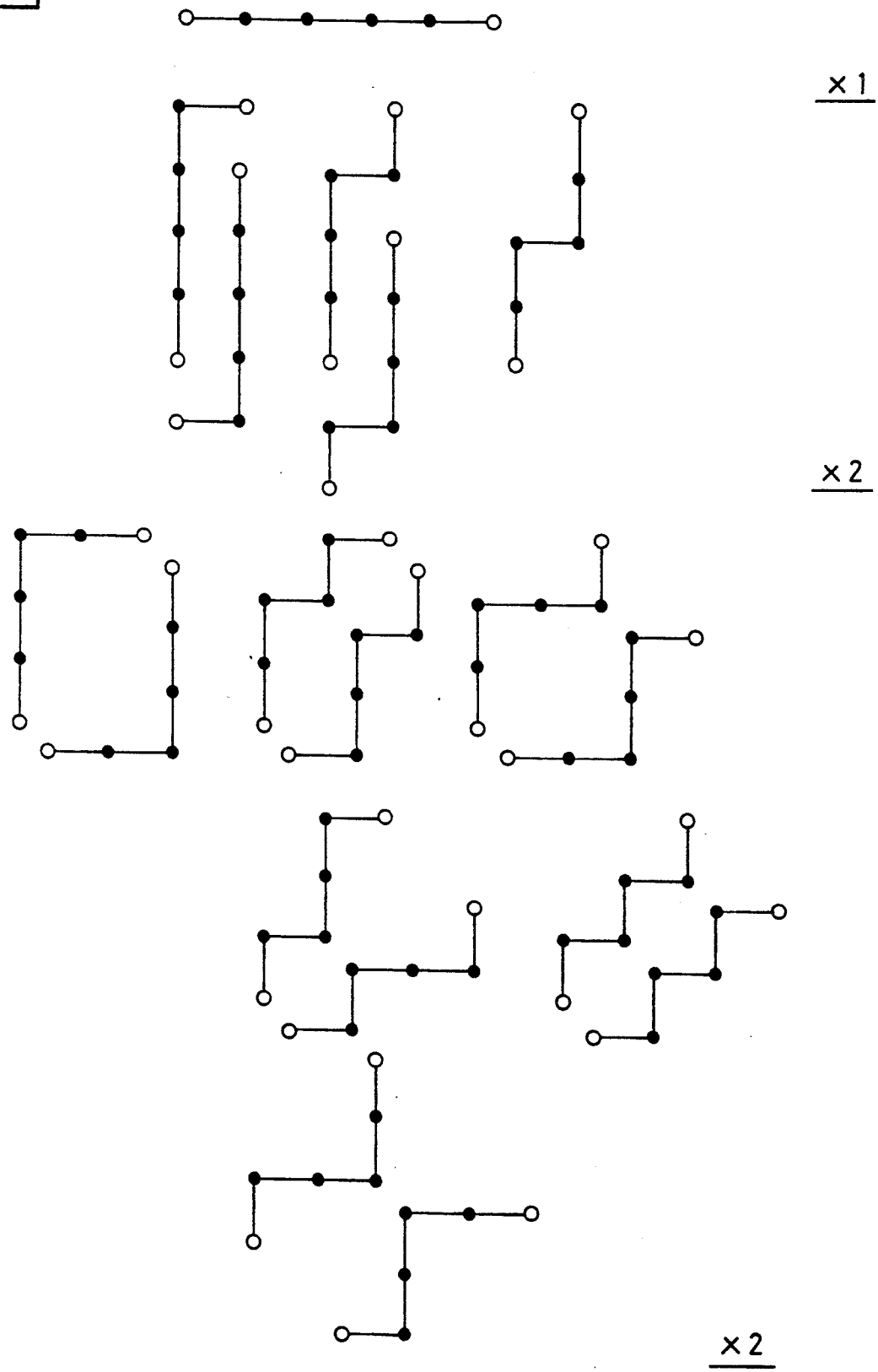
Figure 4A:
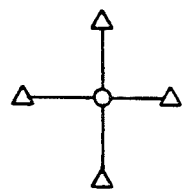
FIGS. 4A through 4E are views each illustrating the other examples of wiring patterns where wirings are extended to the normalized wiring lengths from the center to upper and lower, and left and right portions.
Figure 4B:
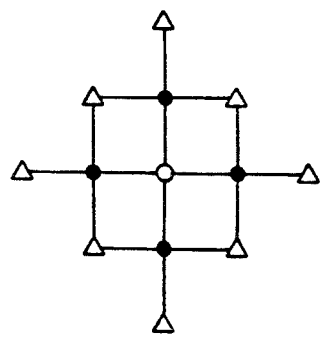
Figure 4C:
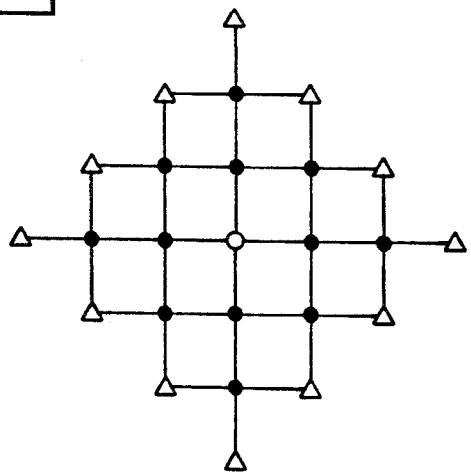
Figure 4D:
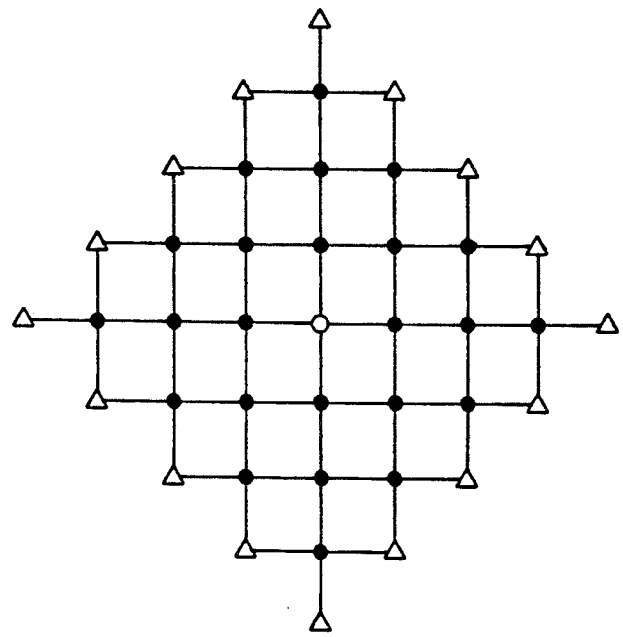
Figure 4E:
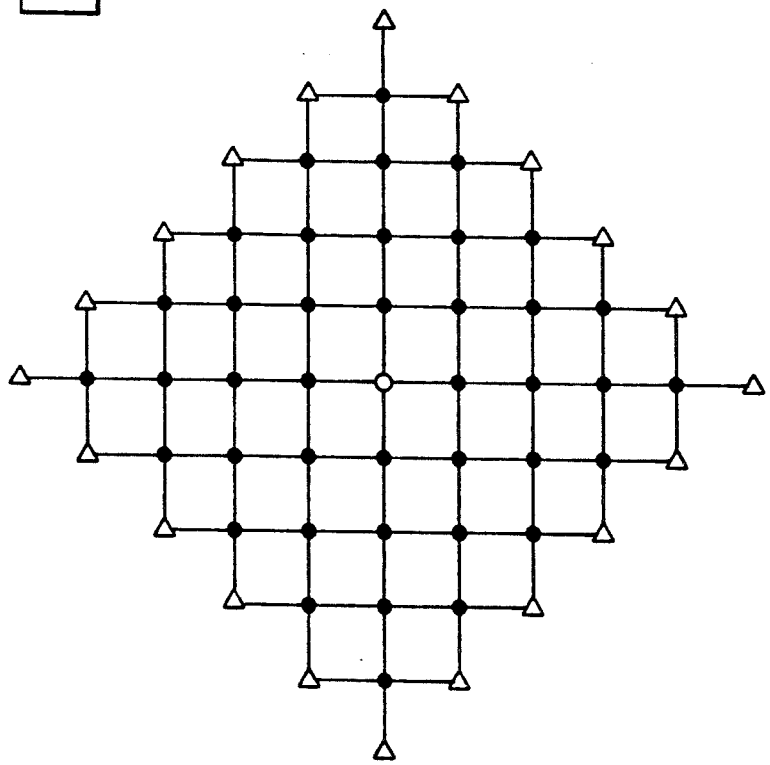
Figure 5:
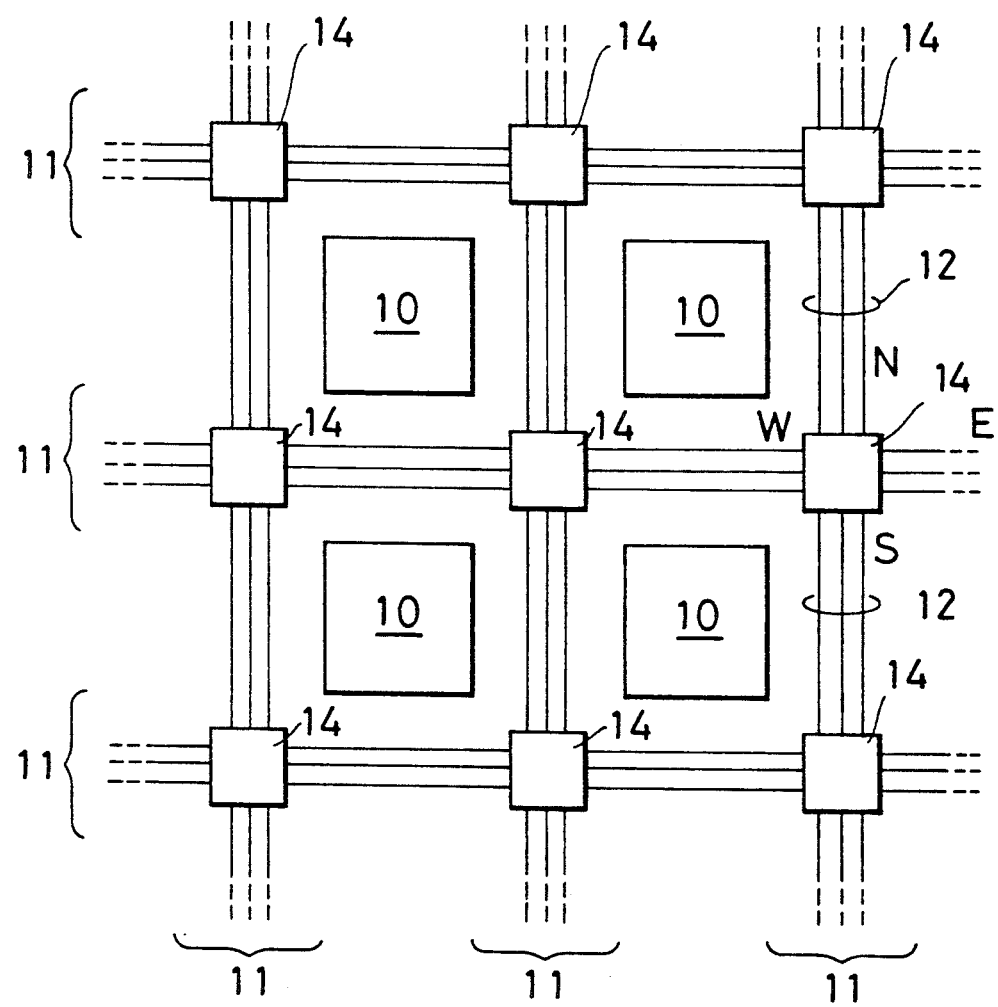
FIG. 5 is a plan view exemplarily illustrating a programmable wiring in a channel region wiring of a semiconductor integrated circuit.

In the present embodiment, programmable switches are provided in a switching matrix 14 as schematically illustrated in FIG. 1. In FIG. 1, programmable switches for connecting wiring elements 12 with each other in a straight direction and in a turn direction in the programmable switch are indicated by "O" and "●", respectively. Further, as illustrated in FIG. 1, the 12 programmable switches in the straight direction, and the 28 programmable switches in the turn direction are provided, respectively. Accordingly, the ratio of the respective programmable switches is 12:28=0.43:1. Some programmable switches which will be connected to the peripheral wiring elements 1 or 3 are neglected, and a programmable switch is securely provided between the central wiring elements 2—2.

Herely, there is eliminated the occurrence of any wiring element unuseable upon connecting wiring elements by a programming.

Herein, although in the above embodiment the switching matrix of the programmable switch was exemplarily described as illustrated in FIG. 1, a programmable switch upon practising the present invention is not limited to that illustrated in the figure. Essentially, provided the arrangement ratio of the programmable switches for connecting the wiring elements in the straight direction and in the turn direction ranges between 0.2:1 and 0.5:1, the switch can be provided in a proper arrangement.

What is claimed is:

1. A programmable wiring for connecting wiring elements in a channel region with each other in a programmable manner wherein programmable switches less than the number of all combinations in the direction of connections are provided in a switching matrix for connecting the wiring elements with each other, and that the number of programmable switches for connecting the wiring elements in a straight direction is less than the number of programmable switches for connecting the wiring elements with each other in a turn direction, each programmable switch comprising a static random access memory.

2. A programmable wiring according to claim 1 wherein some of the programmable switches connected to the wiring elements located in the vicinity of the surroundings of the wiring are omitted, and the programmable switches are provided among the wiring elements in the vicinity of the center of the wiring.

3. A programmable wiring for connecting wiring elements in a channel region with each other in a programmable manner characterized in that programmable switches less than a number of all combinations in a direction of connection are provided in a switching matrix for connecting the wiring elements with each other, such that the number of programmable switches for connecting the wiring elements in a straight direction is less than the number of programmable switches for connecting the wiring elements with each other in a turn direction, wherein a ratio of the number of the programmable switches in the straight direction to the number of the programmable switches in the turn direction ranges from 0.2:1 to 0.5:1.

4. A programmable wiring for connecting wiring elements in a channel region with each other in a programmable manner characterized in that programmable switches less than a number of all possible combinations of programmable switches in a direction of the connections are provided in a switching matrix for connecting the wiring elements with each other, such that a first ratio of provided programmable switches to possible programmable switches for connecting the wiring elements in a straight direction is less than or equal to a second ratio of provided programmable switches to possible programmable switches for connecting the wiring elements with each other in a turn direction, and a ratio between the first ratio and the second ratio range from 0.40:1 to 1:1.

* * * * *

UNITED STATES PATENT AND TRADEMARK OFFICE
CERTIFICATE OF CORRECTION

PATENT NO. : 5,153,463

DATED : October 6, 1992

INVENTOR(S) : Keiichi KAWANA

It is certified that error appears in the above-identified patent and that said Letters Patent is hereby corrected as shown below:

On the title page, Item [19] and [75]:
      change "Kawana Keiichi" to --Keiichi Kawana--.

Signed and Sealed this

Twenty-first Day of September, 1993

Attest:

BRUCE LEHMAN

*Attesting Officer*      *Commissioner of Patents and Trademarks*